United States Patent
Kavalieros et al.

(10) Patent No.: US 10,546,858 B2
(45) Date of Patent: Jan. 28, 2020

(54) LOW DAMAGE SELF-ALIGNED AMPHOTERIC FINFET TIP DOPING

(71) Applicant: Intel Corporation, Santa Clara, CA (US)

(72) Inventors: Jack T. Kavalieros, Portland, OR (US); Chandra S. Mohapatra, Beaverton, OR (US); Anand S. Murthy, Portland, OR (US); Willy Rachmady, Beaverton, OR (US); Matthew V. Metz, Portland, OR (US); Gilbert Dewey, Hillsboro, OR (US); Tahir Ghani, Portland, OR (US); Harold W. Kennel, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/579,180

(22) PCT Filed: Jun. 27, 2015

(86) PCT No.: PCT/US2015/038197
§ 371 (c)(1),
(2) Date: Dec. 1, 2017

(87) PCT Pub. No.: WO2017/003414
PCT Pub. Date: Jan. 5, 2017

(65) Prior Publication Data
US 2018/0226405 A1    Aug. 9, 2018

(51) Int. Cl.
*H01L 27/092* (2006.01)
*H01L 29/08* (2006.01)
(Continued)

(52) U.S. Cl.
CPC ...... *H01L 27/0924* (2013.01); *H01L 21/2258* (2013.01); *H01L 21/30612* (2013.01);
(Continued)

(58) Field of Classification Search
CPC .................. H01L 27/0924; H01L 29/66462
See application file for complete search history.

(56) References Cited

U.S. PATENT DOCUMENTS

| 4,035,205 A | 7/1977 | Lebailly et al. |
| 9,640,622 B2 | 5/2017 | Goel et al. |

(Continued)

FOREIGN PATENT DOCUMENTS

| EP | 0565054 | 10/1993 |
| WO | 2014209390 | 12/2014 |

OTHER PUBLICATIONS

Extended European Search Report from European Patent Application No. 15897305.7 dated Jan. 30, 2019, 10 pgs.
(Continued)

*Primary Examiner* — Xia L Cross
(74) *Attorney, Agent, or Firm* — Green, Howard & Mughal LLP

(57) ABSTRACT

Monolithic finFETs including a majority carrier channel in a first III-V compound semiconductor material disposed on a second III-V compound semiconductor. While a mask, such as a sacrificial gate stack, is covering the channel region, a source of an amphoteric dopant is deposited over exposed fin sidewalls and diffused into the first III-V compound semiconductor material. The amphoteric dopant preferentially activates as a donor within the first III-V material and an acceptor with the second III-V material, providing transistor tip doping with a p-n junction between the first and second III-V materials. A lateral spacer is deposited to cover the tip portion of the fin. Source/drain regions in regions of
(Continued)

the fin not covered by the mask or spacer electrically couple to the channel through the tip region. The channel mask is replaced with a gate stack.

12 Claims, 12 Drawing Sheets

(51) Int. Cl.
| | |
|---|---|
| *H01L 29/78* | (2006.01) |
| *H01L 27/06* | (2006.01) |
| *H01L 21/306* | (2006.01) |
| *H01L 29/66* | (2006.01) |
| *H01L 21/225* | (2006.01) |
| *H01L 21/324* | (2006.01) |
| *H01L 21/8258* | (2006.01) |
| *H01L 29/205* | (2006.01) |
| *H01L 29/207* | (2006.01) |

(52) U.S. Cl.
CPC ...... *H01L 21/3245* (2013.01); *H01L 21/8258* (2013.01); *H01L 27/0605* (2013.01); *H01L 29/0847* (2013.01); *H01L 29/66462* (2013.01); *H01L 29/66522* (2013.01); *H01L 29/66545* (2013.01); *H01L 29/66803* (2013.01); *H01L 29/7851* (2013.01); *H01L 29/205* (2013.01); *H01L 29/207* (2013.01)

(56) References Cited

U.S. PATENT DOCUMENTS

| | | |
|---|---|---|
| 2010/0163926 A1 | 7/2010 | Hudait et al. |
| 2012/0161105 A1* | 6/2012 | Rachmady ............. B82Y 10/00 257/19 |
| 2013/0052801 A1* | 2/2013 | Berliner ................ H01L 21/845 438/468 |
| 2013/0175659 A1 | 7/2013 | Liu |
| 2013/0285155 A1 | 10/2013 | Glass et al. |
| 2014/0264446 A1 | 9/2014 | Basu et al. |
| 2014/0332855 A1* | 11/2014 | Cheng .................... H01L 19/20 257/201 |
| 2014/0332900 A1 | 11/2014 | Basu et al. |
| 2014/0353574 A1 | 12/2014 | Li et al. |
| 2015/0054031 A1 | 2/2015 | Glass et al. |
| 2015/0093868 A1 | 4/2015 | Obradovic et al. |

OTHER PUBLICATIONS

Schubert, E. F., "Doping in III-V Semiconductors", Press Syndicate of the University of Cambridge, 1993, 30 pgs.

International Search Report and Written Opinion from PCT/US2015/038197 dated Mar. 25, 2016, 12 pgs.

International Preliminary Report on Patentability from PCT/US/2015/38197 dated Jan. 11, 2018, 11 pgs.

* cited by examiner

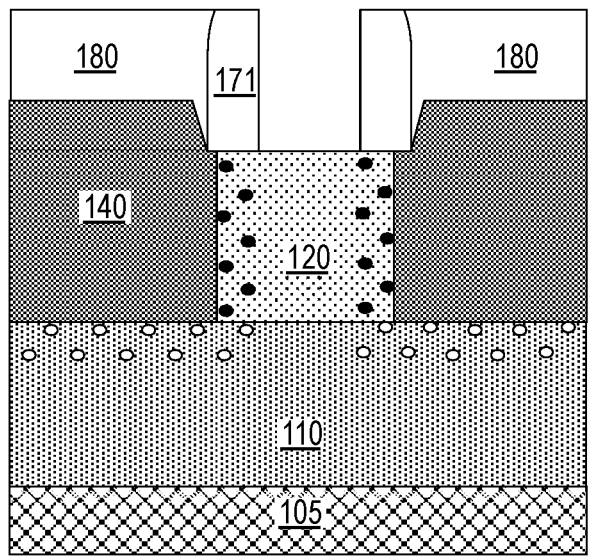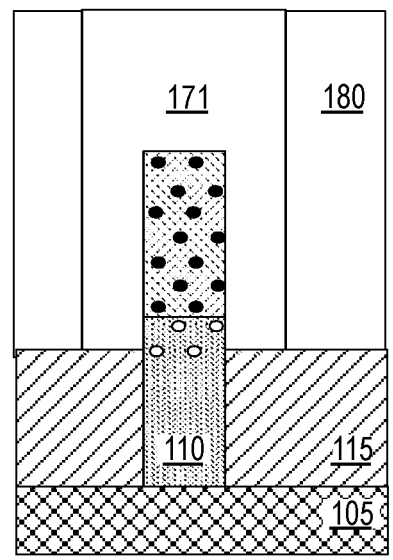
FIG. 5I  FIG. 6I
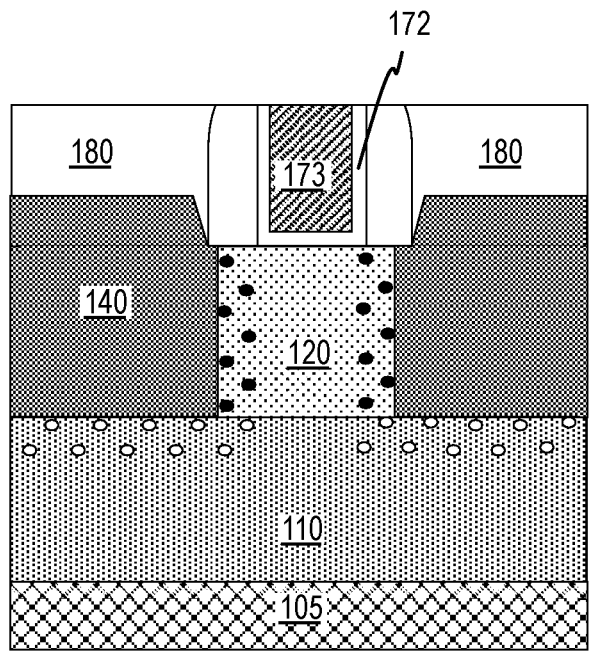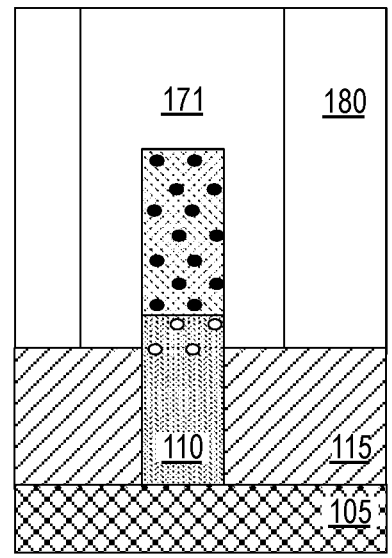
FIG. 5J  FIG. 6J

LOW DAMAGE SELF-ALIGNED AMPHOTERIC FINFET TIP DOPING

CLAIM OF PRIORITY

This Application is a National Stage Entry of, and claims priority to, PCT Application No. PCT/US2015/038197, filed on 27 Jun. 2015 and titled "LOW DAMAGE SELF-ALIGNED AMPHOTERIC FINFET TIP DOPING", which is incorporated by reference in its entirety for all purposes.

BACKGROUND

Efforts to extend Moore's law for integrated circuitry (IC) have included the development of transistors employing III-V compound semiconductor materials (e.g., InP, InGaAs, InAs). While these non-silicon material systems have been employed to fabricate metal oxide semiconductor field effect transistors (MOSFET) and other forms of high mobility transistors (HEMT), the devices often suffer performance limitations associated with a difficultly in doping the III-V materials to desired conductivity types and levels of activation. For example, doping by ion implantation processes conventional in the fabrication of silicon-based FETs induces detrimental damage in III-V compound semiconductor materials that is not readily annealed out.

III-V transistor architectures with active dopants that are precisely located relative to the channel region with techniques that avoid damage to the III-V semiconductor material(s) are therefore advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIGS. 5A, 5B, 5C, 5D, 5E, 5F, 5G, 5H, 5I, 5J and 5K illustrate cross-sectional views through a length of the channel region, lightly-doped regions, and source/drain regions of a III-V finFET evolving as the method illustrated in FIG. 4 is performed, in accordance with some embodiments;

FIGS. 6A, 6B, 6C, 6D, 6E, 6F, 6G, 6H, 6I, 6J and 6K illustrate cross-sectional views through a width of a fin structure within a lightly-doped region of a III-V finFET evolving as the method illustrated in FIG. 4 is performed, in accordance with some embodiments;

DETAILED DESCRIPTION

Figure 1:
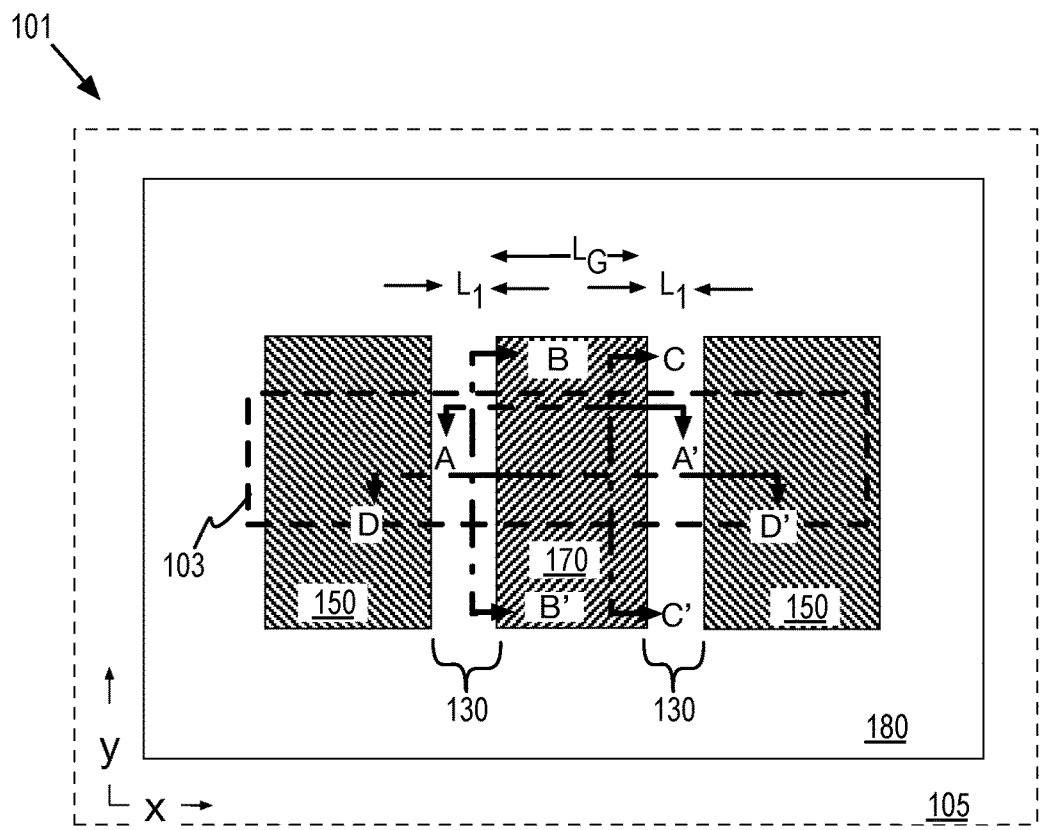
FIG. 1 is a plan view of a III-V finFET including active dopants in a lightly-doped region of the fin structure, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" or "some embodiments" means that a particular feature, structure, function, or characteristic described in connection with the embodiment is included in at least one embodiment of the invention. Thus, the appearances of the phrase "in an embodiment" or "in one embodiment" or "some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

The inventors have found that for FETs employing III-V compound semiconductor material, it is often difficult to achieve low device resistance and avoid significant short channel effects (SCE). For highest carrier mobility, a transistor channel region is advantageously doped as lightly as possible (e.g., ideally undoped). Source/drain regions however are advantageously doped as heavily as possible for low external resistance. Even when both of these conditions are met, difficulty in controlling III-V material doping between the channel region and source/drain regions is one factor contributing to the observed limitations in device performance metrics.

In silicon devices, many advanced ion implants have been implemented to control dopant profiles between the channel region and source/drain, as well as below the channel region. For example, a high-angle, low energy (HALO) ion implantation is often employed to introduce p-type dopants below an n-type channel, thereby reducing transistor off-state leakage current $I_{off}$. Well-controlled ion implantation is also often employed to lightly dope tip regions in so call "underlapped" gate architectures. With an underlapped gate, heavily doped source/drain regions are separated from a gate electrode stack by an intervening lateral spacing of semiconductor material that is lightly doped to the conductivity type of the source/drain so as to minimize transistor on-state resistance ($R_{on}$) associated with the underlap while improving off-state leakage current $I_{off}$. These implantation techniques however do not readily transfer to III-V material systems for at least the reason that conventional implantation of ionic dopant species induces damage in III-V compound semiconductor materials that is not readily annealed out. Implanted dopants also may not activate or diffuse in the manner relied upon for silicon device architectures.

In some embodiments, a non-silicon finFET includes a non-planar, monocrystalline III-V semiconductor material device region (e.g., a fin channel region) disposed over a heterogeneous monocrystalline III-V semiconductor material (e.g., a sub-fin region). While a mask, such as a sacrificial gate stack, protects the channel region, a source of dopant is deposited over exposed fin surfaces and diffused into at least the III-V compound semiconductor fin material. In some embodiments, the dopant is an amphoteric dopant that preferentially activates as an electron donor within the III-V fin material. Introduction of this dopant within a tip region of the fin adjacent to the fin channel region may thereby provide a light doping of the same conductivity type as more heavily doped source/drain regions. In further embodiments, amphoteric dopant introduced into the sub-fin preferentially activates as an electron acceptor within this second III-V material, thereby providing or maintaining a lightly doped p-type sub-tip region disposed below the n-type tip region. This complementary doping of the sub-tip region may reduce off-state leakage $I_{off}$ and/or improve the transistor SCE in a manner akin to a p-pocket implant of a silicon NMOS device. Differences in amphoterism between the different III-V materials of the fin and sub-fin are thereby leveraged to control a vertical positioning of the tip and sub-tip regions. Precise control of lateral positioning of the tip and sub-tip regions may be further achieved by masking the channel region during a low-damage, surface-based amphoteric doping of both the tip and sub-tip. Precise control of lateral dimensions of the tip and sub-tip regions may be further achieved by subsequently forming a self-aligned lateral spacer adjacent to the channel mask to cover both the tip and/or sub-tip regions during source/drain formation. In some embodiments therefore, source/drain regions of a completed III-V finFET electrically couple to the channel through a lightly doped tip region with sub-channel leakage control provided, at least in part, via a complementary doped sub-tip region.

FIG. 1A is a plan view of a non-planar III-V MOS transistor 101 disposed over a first region of a substrate 105 and surrounded by an isolation material 180. In some embodiments, substrate 105 is silicon (Si), which is advantageous for monolithic integration of transistor 101 with conventional silicon-channeled MOSFETs. Transistor 101 may then be an NMOS device and the silicon MOSFET a PMOS device to enable higher performing and/or denser monolithic CMOS integrated circuitry. Crystallographic orientation of a substantially monocrystalline substrate 105 in exemplary embodiments is (100), (111), or (110). However, other crystallographic orientations are also possible. For example, the substrate working surface may be miscut, or offcut, for example 2-10° toward [110], for example to facilitate nucleation of crystalline heteroepitaxial material. Other substrate embodiments are also possible. For example, substrate 105 may be any of silicon-carbide (SiC), sapphire, III-V compound semiconductor (e.g., GaAs), silicon on insulator (SOI), germanium (Ge), or silicon-germanium (SiGe).

Isolation material 180 may be any material suitable for providing electrical isolation between transistors. In some exemplary embodiments, isolation material 180 is silicon dioxide. Other materials known to be suitable for the purpose may also be utilized, including low-k materials (e.g., having a relative dielectric constant below 2.5). Although embodiments are not limited in this respect, other exemplary isolation materials include carbon-doped oxides (CDO), siloxane derivatives and polymer dielectrics (e.g., benzocyclobutene, porous methyl silsesquioxane).

In exemplary embodiments, transistor 101 incudes a III-V compound semiconductor heterojunction fin ("hetero-fin") structure 103 that further includes a "fin" of a first III-V compound semiconductor material disposed on a "sub-fin" of a second III-V compound semiconductor material, as further described below. Disposed over a channel region of the hetero-fin structure 103 is a gate stack 170. Gate stack 170 is associated with a non-zero gate length $L_g$, which may vary with implementation, but in some embodiments is 50 nm, or less (e.g., 20 nm, 10 nm, etc.). Laterally spaced apart from gate stack 170 is source/drain contact metallization 150, making electrical contact to underlying heavily-doped III-V compound semiconductor source/drain regions.

A lightly-doped hetero-fin region 130 disposed between the channel region and source/drain regions is associated with a non-zero lateral spacing $L_1$. Lateral spacing $L_1$ may also vary with implementation, but in some embodiments is 10 nm, or less (e.g., 5 nm). Hetero-fin region 130 is doped with a dopant to a level (e.g., atoms/cm$^3$) lower than that of adjacent source/drain regions. In some exemplary embodiments, hetero-fin region 130 has a dopant level of $10^{11}$-$10^{15}$/cm3. In some advantageous embodiments, hetero-fin region 130 is doped with a dopant that is substantially absent from source/drain regions. In some further embodiments, hetero-fin region 130 is doped with a dopant to a level greater than that of the adjacent channel region. In some advantageous embodiments, hetero-fin region 130 is doped with a dopant that is substantially absent from the adjacent channel region.

Figure 2A:
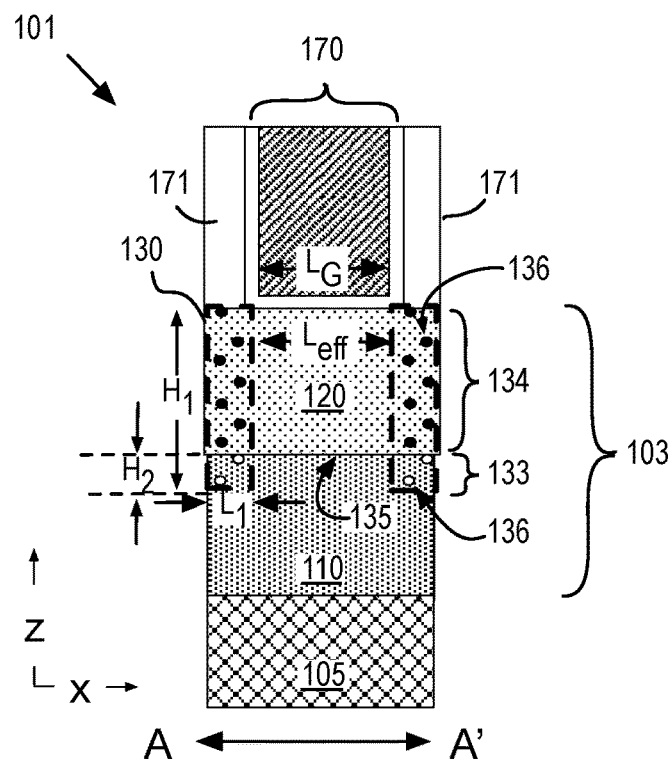
FIG. 2A illustrates a cross-sectional view through a length of the channel region and lightly-doped region of the III-V finFET depicted in FIG. 1A, in accordance with some embodiments.

FIG. 2A illustrates a cross-sectional view through a length of III-V transistor 101 along the A-A' plane denoted in FIG. 1. The length along the A-A' plane includes lightly-doped hetero-fin region 130 and a portion of hetero-fin 103 disposed below gate stack 170, in accordance with some embodiments. As further illustrated in FIG. 2A, hetero-fin 103 includes a fin 120 of a first III-V compound semiconductor disposed on a sub-fin 110 of a second III-V compound semiconductor. The two III-V materials of differing composition form a heterojunction 135 at their interface associated with some bandgap differential leading to one or more of a conduction band offset and valence band offset between the fin 120 and sub-fin 110.

In some embodiments, sub-fin 110 and fin 120 are each monocrystalline with a first sub-lattice of at least one element from group III of the periodic table (e.g., Al, Ga, In, etc.), and a second sub-lattice of at least one element of group V of the periodic table (e.g., N, P, As, Sb, etc.). Sub-fin 110 and fin 120 may each be a binary, ternary, or quaternary III-V compound semiconductor including two, three, or even four elements from groups III and V of the periodic table, respectively. As fin 120 is a device layer of transistor 101, it is advantageously a III-V material having a high carrier (e.g., electron) mobility, such as, but not limited to InGaAs, InP, InSb, GaAs, and InAs. For some exemplary InGaAs fin embodiments, the mole fraction of In is between 0.2 and 0.8. In some advantageous embodiments, a channel region of fin 120 associated with an effective channel length $L_{eff}$ is intrinsic III-V material and not intentionally doped with any electrically active impurity. Sub-fin 110 is advantageously a III-V material having a significant (e.g., conduction) band offset to the fin material, such as but not limited to GaAs, InP, GaSb, GaAsSb, GaP, InAlAs, GaAsSb, AlAs, AlP, AlSb, and AlGaAs. In some embodiments, fin 120, and sub-fin 110 are of complementary impurity types.

For example, where fin 120 is to provide an electron majority carrier channel, sub-fin 110 may be doped with p-type impurities, such as Mg and Be.

In some embodiments, at least one of a fin tip region and a sub-tip region of a sub-fin within a heterojunction fin are doped with an electrically active dopant. Hetero-fin region 130 denoted by dashed line in FIG. 2A, includes a sub-tip region 133 of sub-fin 110, and a tip region 134 of fin 120. Tip region 134 is disposed at opposite ends the channel region. Tip region 134 is further disposed below lateral spacers 171. In some embodiments where the channel region is intrinsic (i.e., no intentional doping) and the source/drain is a re-grown material, tip region 134 is the only extrinsically doped portion of fin 120. As noted above, dopant levels within fin tip regions (and/or sub-tip regions) are significantly lower than a source/drain impurity level. The light dopant level of the fin tip region may vary by many orders of magnitude. In some exemplary embodiments fin tip regions have dopant levels of $10^{11}$-$10^{15}$/cm3. Effective activation efficiencies may also very widely, for example between 10% and 100%.

In exemplary embodiments, tip region 134 is extrinsically doped with one or more amphoteric dopants 136. An amphoteric dopant comprises an atom that may occupy either a lattice site within the group III sub-lattice or a lattice site within the group V sub-lattice. When an amphoteric dopant occupies a group III sub-lattice, it will act as a donor rendering the III-V material N-type. When the amphoteric dopant instead occupies a group V sub-lattice, it will act as an acceptor, rendering the III-V material more P-type. In some exemplary embodiments, amphoteric dopants 136 are Si. Alternate amphoteric dopant embodiments include Ge, Sn, Te, Se, O, and C. In some further embodiments, amphoteric dopants 136 include more than one amphoteric dopant (e.g., Si and Ge, Si and Sn, Si and Te, Si and Se, or any other combination of two or more of amphoteric dopants). In some exemplary embodiments where the channel region of fin 120 is intrinsic, the only extrinsic dopants present in tip region 134 are amphoteric dopants 136. In other embodiments where the channel region of fin 120 is extrinsically doped, for example with an n-type dopant, tip region 134 may be doped both with amphoteric dopants 136 and the channel dopant.

In some embodiments, sub-tip region 133 is extrinsically doped with one or more impurity element. As illustrated in FIG. 2A, sub-tip region 133 is disposed immediately below tip region 134. For embodiments where sub-fin 110 is doped complementary to fin 120, doping of tip region 134 preferably does not counter-dope sub-tip region 133. For embodiments where sub-fin 110 is not doped complementary to fin 120 (e.g., sub-fin 110 is intrinsic), doping of tip region 134 preferably does not also render sub-tip region 133 the same conductivity type as tip region 134. In advantageous embodiments, both tip region 134 and sub-tip region 133 include amphoteric dopants 136. In some such embodiments, both tip region 134 and sub-tip region 133 are doped to the same level, or concentration, of amphoteric dopants 136. As described further below, equal amphoteric doping levels between tip region 134 and sub-tip region 133 are indicative of the process employed to introduce the amphoteric dopants 136.

In some embodiments, amphoteric dopants 136 preferentially activate as a first impurity type in fin 120, and preferentially activate as the complementary impurity type in sub-fin 110. This differing amphoterism is leveraged in transistor 101 to precisely control the vertical (z) limits of tip region 134 and/or sub-tip region 133 so as to coincide with heterojunction 135. Hence, in FIG. 2A, doping of the entire hetero-fin region 130 within the dashed box spanning z-height $H_1$ provides a sub-tip region 133 that has a z-height of only $H_2$ below heterojunction 135, and concurrently provides a tip region 134 that has a z-height of only $H_1-H_2$ above heterojunction 135 Amphoteric dopants 136 may be further precisely controlled to lateral dimension $L_1$, for example by introducing amphoteric dopants 136 using well-developed self-aligned fabrication techniques. Hence, differing amphoterism can enable relatively unselective introductions of amphoteric dopants to hetero-fin 103, some of which may advantageously induce little, if any, III-V lattice damage.

In one advantageous embodiment where fin 120 comprises a III-V material with high electron mobility, hetero-fin region 130 is doped with amphoteric dopants 136 that preferentially activate as n-type donors (illustrated as solid dots) within tip region 134 and preferentially activate as p-type acceptors (illustrated as holes) within sub-tip region 133. P-type doping of sub-tip region 133 may enhance performance of transistor 101 in manners similar to HALO or pocket implants in silicon-channeled devices, for example reducing $I_{off}$ and SCE. Likewise, n-type doping of tip region 134 may enhance performance of transistor 101 in manners similar to tip implants in silicon-channeled devices, for example reducing $R_{ext}$.

Control over whether amphoteric dopants will on balance activate as one type or another may be through a variety of factors such as, but not limited to, amphoteric dopant concentration, intrinsic lattice composition, the presence of other (co)impurities in the lattice, and the amphoteric dopant activation conditions. In some embodiments, therefore amphoteric dopant concentration is different between fin 120 and sub-fin 110 (e.g., higher concentration in fin 120) to drive complementary activation. However, even for embodiments where amphoteric doping levels in tip region 134 and sub-tip region 133 are equal, the effective conductivity type of activated dopants may nevertheless be driven complementary, for example through differences in the intrinsic lattice compositions of sub-fin 110 and fin 120. Addition of tertiary and quaternary sub-lattices to one or the other of fin 120 and sub-fin 110 may drive advantageous amphoterism differences between the two. For example, introduction of larger group III elements may thermodynamically favor incorporation of a smaller amphoteric dopant into group III sites, and vice versa. For an embodiment where fin 120 is InGaAs for example, silicon impurities may on balance occupy more group III sites than group V sites, resulting in an effective n-type doping. However, silicon impurities introduced into a GaAs sub-fin 110, for example, may preferentially occupy more group V sites, resulting in an effective p-type doping.

Figure 2B:
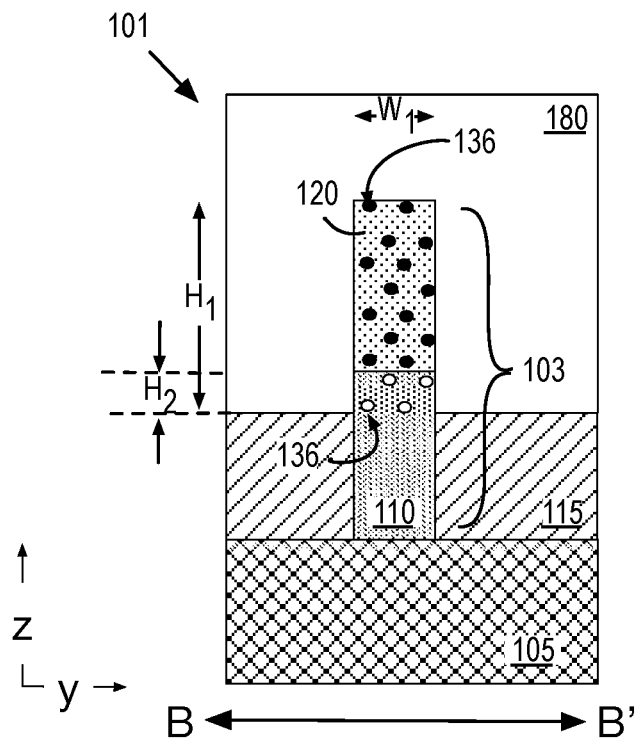
FIG. 2B illustrates a cross-sectional view through a fin width within a lightly doped region of the III-V finFET depicted in FIG. 1A, in accordance with some embodiments.

FIG. 2B illustrates a cross-sectional view through a hetero-fin width along the B-B' plane denoted in FIG. 1A, in accordance with some embodiments. The B-B' plane passes through hetero-fin region 130 of finFET 101. As illustrated, along the fin z-height $H_1$, amphoteric dopants 136 are present through the entire hetero-fin width $W_1$. Width $W_1$ may vary with implementation, but in exemplary embodiments is less than 20 nm and advantageously less than 10 nm. In some embodiments, as further illustrated in FIG. 2B, the amphoterically doped portion of hetero-fin 103 is that which extends above a sub-fin isolation 115. In other words the entire fin z-height $H_1$, as measured from a top surface of sub-fin isolation 115 is doped with amphoteric dopants 136. In contrast, there is substantially no amphoteric dopants 136 within portions of sub-fin 110 embedded within sub-fin isolation 115. Sub-fin isolation 115 may be any amorphous material suitable for providing electrical isolation between adjacent sub-fins. In some exemplary embodiments, sub-fin isolation 115 is silicon dioxide. Other known dielectric materials may also be employed, including low-k materials. Although embodiments are not limited in this respect, other exemplary materials include carbon-doped oxides (CDO), siloxane derivatives, and the like.

Figure 2C:
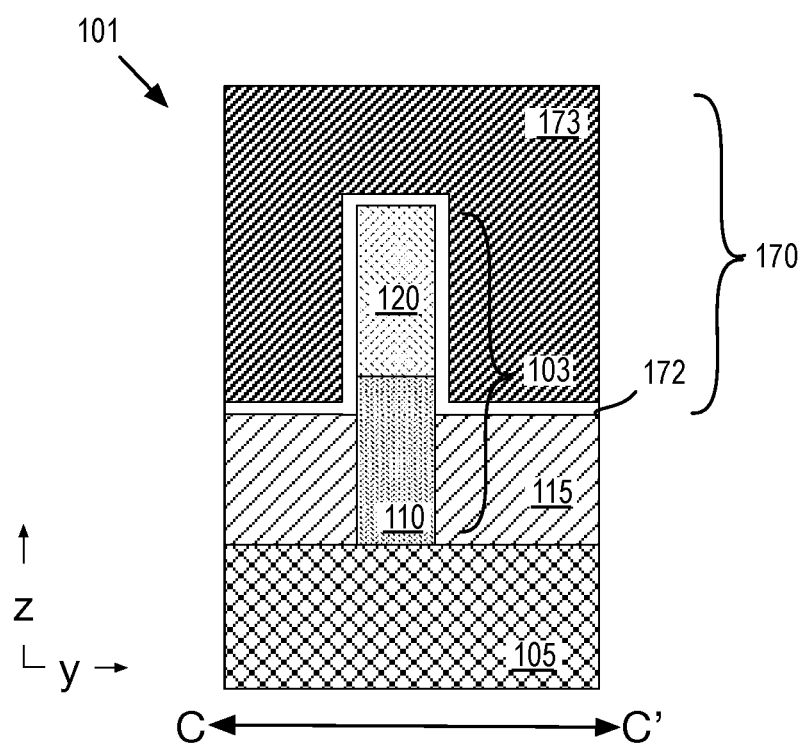
FIG. 2C illustrates a cross-section view through a fin width within a channel region of the III-V finFET depicted in FIG. 1A, in accordance with some embodiments.

FIG. 2C illustrates a cross-sectional view through a hetero-fin width along the C-C' plane denoted in FIG. 1A, in accordance with some embodiments. The C-C' plane passes through the channel region of the III-V finFET 101. As illustrated, gate stack 170 includes a gate dielectric material 172 and a gate electrode material 173. While any known gate stack materials may be utilized, in one exemplary embodiment a high-k material (e.g., having a bulk relative dielectric constant of 9, or more) is employed with gate metal having a work function suitable for the composition of fin 120. In the exemplary embodiments illustrated by FIG. 2C, amphoteric dopants are absent from both the channel region of fin 120 and the sub-channel region of fin 110.

Figure 2D:
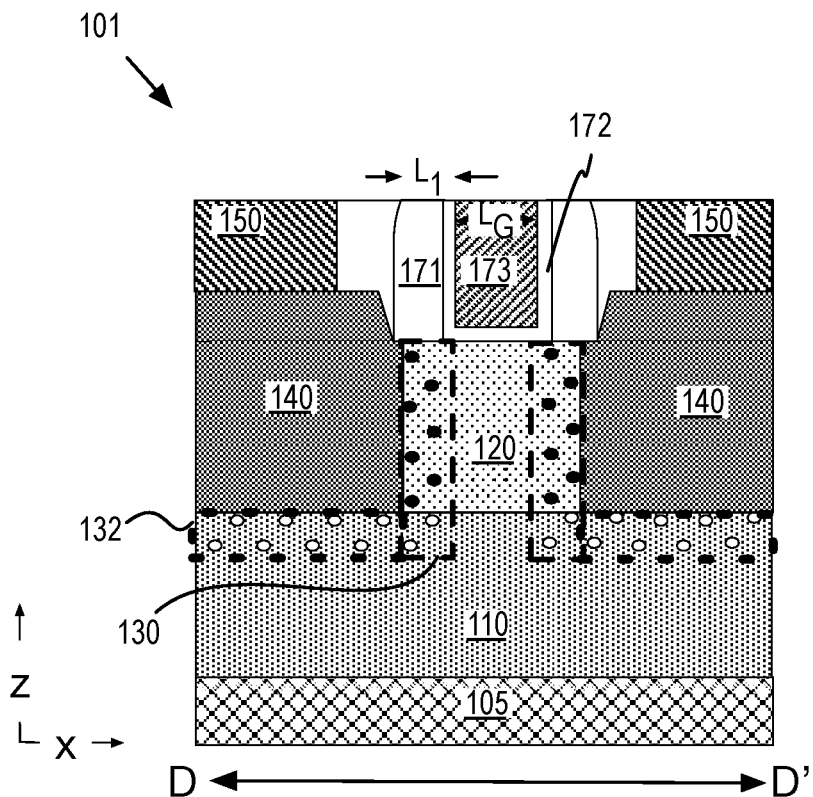
FIG. 2D illustrates a cross-sectional view through a length of the channel region, lightly-doped region, and source/drain regions of the III-V finFET depicted in FIG. 1A, in accordance with some embodiments.

FIG. 2D illustrates a cross-sectional view through a length of the channel region, tip region, and source/drain regions of the III-V finFET 101, in accordance with some embodiments. FIG. 2D expands the field of view beyond that illustrated in FIG. 2A to further illustrate lightly doped portions of sub-fin 110 and fin 120 relative to a heteroepitaxial source/drain 140. In some embodiments, heteroepitaxial source/drain 140 comprises a III-V compound semiconductor with distinct lattice constituents to provide an advantageously low band gap facilitating low resistance with contact metallization 150. Heteroepitaxial raised source/drain material 140 may be any material suitable for ohmic contact to fin 120, such as, but not limited to, InAs. In some embodiments, source/drain material 140 is single crystalline. Heteroepitaxial raised source/drain material 140 is advantageously heavily doped (e.g., n-type in InAs embodiments).

In the exemplary embodiment illustrated in FIG. 2D, lightly-doped hetero-fin region 130 interfaces with heteroepitaxial raised source/drain 140 such that the channel region of transistor 101 is electrically coupled to source/drain 140 through tip region 134 (FIG. 2A). As further illustrated in FIG. 2D, heteroepitaxial raised source/drain 140 forms a first heterojunction with fin 120, and a second heterojunction with sub-fin 110. In some exemplary embodiments, heteroepitaxial source/drain 140 lacks any amphoteric dopants, which is indicative of source/drain 140 having been formed subsequent to amphoteric doping of fin 120 and/or sub-fin 110. With light-doped hetero-fin region 130 long the first source/drain heterojunction however, amphoteric dopants are preferentially activated to the same conductivity type as source/drain 140 (e.g., n-type). Within a sub-source/drain region 132 along the second heterojunction (denoted in FIG. 2D by small dashed line boxes), amphoteric dopants are preferentially activated to a conductivity type complementary to source/drain 140 (e.g., p-type). In some embodiments, the amphoteric dopant within sub-source/drain region 132 is the same as that within hetero-fin region 130. In further embodiments, the amphoteric dopant concentration within sub-source/drain region 132 is the same as that within hetero-fin region 130. This equality of dopant concentration is indicative both regions 130 and 132 having been doped concurrently, as described for some embodiments further below.

Figure 3:
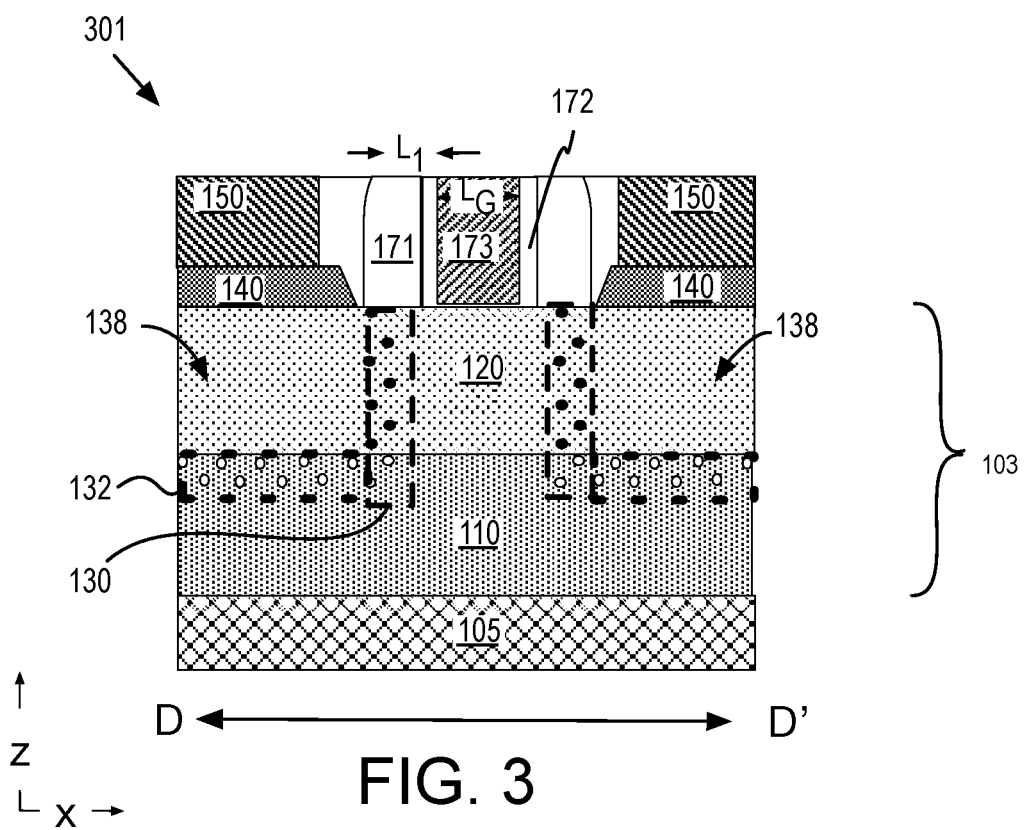
FIG. 3 illustrates a cross-sectional view through a length of the channel region, lightly-doped region, and source/drain regions of a III-V finFET, in accordance with some alternative embodiments.

FIG. 3 illustrates a cross-sectional view through a length of the channel region, tip region, and source/drain regions of a III-V finFET 301, in accordance with some alternative embodiments. In the embodiments illustrated by FIG. 3, source/drain regions are not completely regrown as in finFET 101. Instead, fin 120 includes heavily doped source/drain ends 138. Heavily doped source/drain ends 138 comprise the same III-V material as the other regions of fin 120 (e.g., channel region or lightly doped tip region, etc.), but are doped with a greater impurity level. In some exemplary embodiments, doped source/drain ends 138 lack any amphoteric dopants, which is indicative of source/drain region 138 having been formed subsequent to amphoteric doping of fin 120 and/or sub-fin 110. As further illustrated in FIG. 3, doped source/drain ends 138 form one heterojunction with sub-fin 110. Within sub-source/drain region 132 along this heterojunction, amphoteric dopants are preferentially activated to the conductivity type complementary to source/drain ends 138 (e.g., p-type). In some embodiments, the amphoteric dopant within sub-source/drain region 132 is the same as that within hetero-fin region 130. In further embodiments, the amphoteric dopant concentration within sub-source/drain region 132 is the same as that within hetero-fin region 130. This equality of dopant concentration is indicative of both regions 130 and 132 having been doped concurrently, as described for some embodiments further below.

Figure 4:
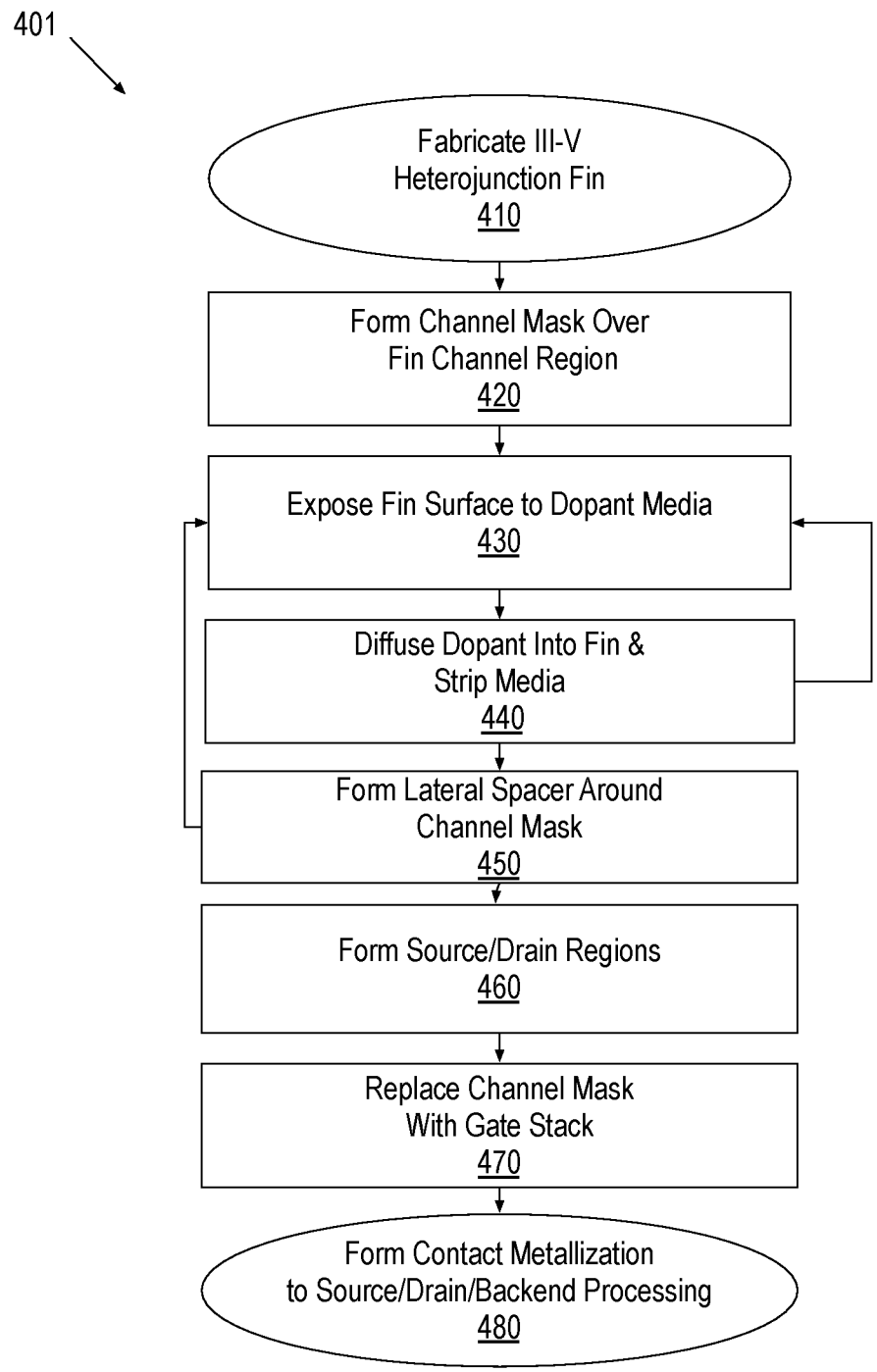
FIG. 4 is a flow diagram illustrating a method of fabricating a III-V finFET with lightly doped regions, in accordance with some embodiments.

III-V finFETs in accordance with the architectures above may be fabricated by a variety of methods applying a variety of techniques and processing chamber configurations. FIG. 4 is a flow diagram illustrating an exemplary method 401 for fabricating a finFET with lightly doped hetero-fin regions, in accordance with some embodiments. FIGS. 5A, 5B, 5C, 5D, 5E, 5F, 5G, 5H, 5I, 5J and 5K illustrate cross-sectional views along the D-D' plane of finFET 101 evolving as the method 401 is performed, in accordance with some embodiments. FIGS. 6A, 6B, 6C, 6D, 6E, 6F, 6G, 6H, 6I, 6J and 6K illustrate cross-sectional views along the B-B' plane of finFET 101 evolving as the method illustrated in FIG. 4 is performed, in accordance with some embodiments.

Referring first to FIG. 4, method 401 begins at operation 410 where a III-V heterojunction fin is fabricated. In some embodiments, numerous islands of III-V material are epitaxially grown over a substrate having a plurality of seeding surface regions. In some such embodiments, seeding surface regions are surrounded by high aspect ratio sidewalls to practice aspect ratio trapping (ART) and achieve acceptable crystal quality in the heteroepitaxial fin material. The ART technique is one example of local additive heteroepitaxial fin fabrication, which may advantageously reduce the effects of thermal mismatch across various heterojunctions. In alternative embodiments, a conventional subtractive technique may be employed in which a blanket III-V film stack is grown over an entire working surface of the substrate, or transferred to the substrate. That blanket film stack is then etched into fin structures similarly amenable to subsequent operations of method 401.

Figure 5A:
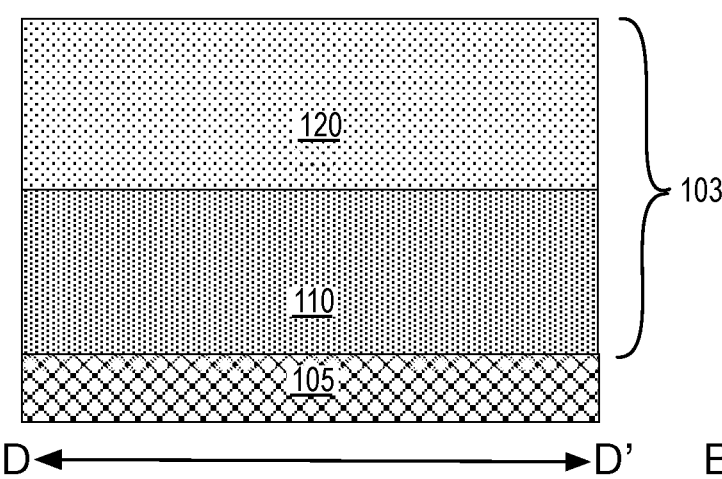
Figure 6A:
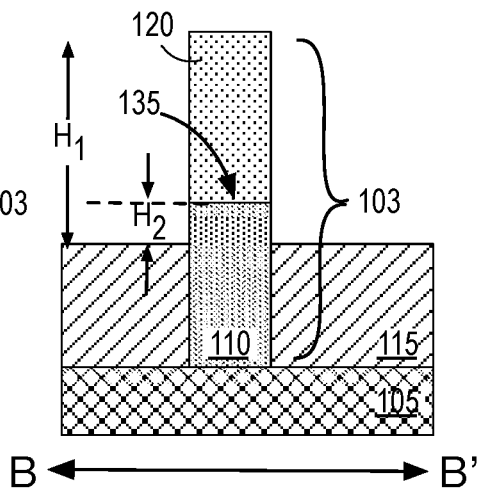
Figure 6B:
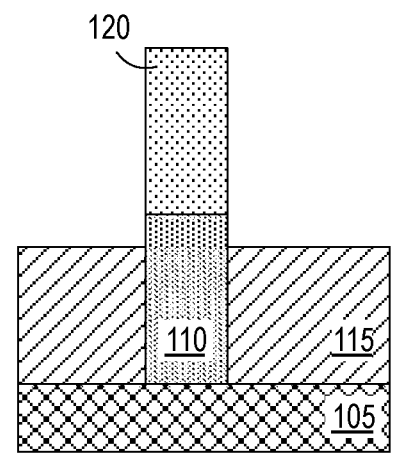

In the exemplary embodiments illustrated by FIGS. 5A and 6A, upon completion of operation 410, hetero-fin 103 is disposed on substrate 105 with at least a portion of fin 120 extending to beyond surrounding sub-fin isolation 115 by a z-height of $H_1$. In some embodiments, z-height $H_1$ is defined by recess etching a predetermined amount of sub-fin isolation material 115 from around hetero-fin 103. Z-height $H_1$ may vary with the extent of recess etch, potentially exposing sidewalls of sub-fin 110 by z-height $H_2$, as further illustrated in FIG. 6A. In alternate embodiments, a stop layer may be utilized to ensure a top surface of sub-fin isolation 115 is flush with heterojunction 135 (not depicted).

Returning to FIG. 4, method 401 continues at operation 420 where a channel mask is patterned to protect a portion of the hetero-fin that is to become the FET channel region. While any known masking technique and material(s) may be employed at operation 420, in some embodiments, the channel mask is a gate mandrel retained through a number of processes until being replaced in a "gate-last" finFET fabrication flow. Such embodiments are advantageously compatible with silicon-channeled finFET fabrication, enabling PMOS transistors to be concurrently fabricated in other regions of the substrate (not depicted). In the exemplary embodiment illustrated in FIGS. 5B and 6B, a sacrificial gate 570 is formed over a portion of the hetero-fin 103. Any known sacrificial gate structure and fabrication techniques may be employed at operation 420 to form sacrificial gate 570 on at least two opposing sidewalls of fin 120, further covering any exposed sidewall portions of sub-fin 110, and landing on sub-fin isolation 115. Sacrificial gate 570 is patterned into a stripe of sacrificial gate 570 extending over the channel region of fin 120 as well as any sub-channel region of sub-fin 110 extending above sub-fin isolation 115. Other portions of hetero-fin 103 are exposed. In some embodiments, sub-fin isolation 115 may be further recessed to expose an additional portion of sub-fin 110 below sacrificial gate 570 (not depicted). Such a recess may be anisotropic to retain underlying sub-fin isolation 115 self-aligned to sacrificial gate 570, or may be isotropic to laterally etch sub-fin isolation 115 and undercut sacrificial gate 570.

Returning to FIG. 4, method 401 continues at operation 430 where surfaces of hetero-fin not protected by the channel mask or sub-fin isolation 115 are exposed to a dopant media. As described above, the dopant in some embodiments is an amphoteric dopant such as any of those listed elsewhere herein (e.g., Si). Fin surfaces exposed to the dopant media are therefore self-aligned to the channel mask (e.g., sacrificial gate). After dopant exposure, dopant is diffused into the hetero-fin at operation 440. Diffused dopant location may be controlled to hetero-fin regions within a diffusion length from a surface contacted with the dopant media.

Exposure to the dopant media at operation 430 may be in various forms, but is advantageously through surface-based techniques that induce little lattice damage in the hetero-fin. One such technique entails deposition of a solid thin film containing mobile dopant. Alternatives include wetting fin surfaces with a liquid agent containing dopant moieties, or exposing fin surfaces to a gaseous agent comprising dopant moieties. Ultra low energy plasma surface treatments may also be practiced. For example, hetero-fin surfaces may be exposed to a plasma of the dopant while the substrate is maintained at a low plasma bias voltage. Any of these known techniques for applying dopants to a material surface compatible with the III-V hetero-fin materials and the amphoteric dopants described herein may be employed without limitation. For liquid and gaseous agents, dopant moieties may react with sidewall (and top) surfaces of the hetero-fin, for example coupling with dangling bonds and/or hydrogen bonds to form a dopant monolayer on fin surfaces. For liquid application of dopants, impurities are dissolved in a solvent. As one example, for a Se doping embodiment, III-V hetero-fin material surfaces may be exposed to an aqueous solution of seleno-DL-methionine ($C_5H_{11}NO_2Se$).

In some embodiments, a capping material layer may be deposited over either the dopant media (e.g. doped thin film) or surface-bound dopant moieties prior to dopant diffusion to promote solid-state in-diffusion of the dopant into the hetero-fin volume and/or retard dopant outgassing or sublimation from the hetero-fin surface. Dopant diffusion may be driven/controlled by any known technique, such as, but not limited to, rapid thermal processing RTP. After dopant diffusion/activation, any capping material may be stripped to again expose surfaces unprotected by the channel mask in preparation for subsequent processing.

Figure 5B:
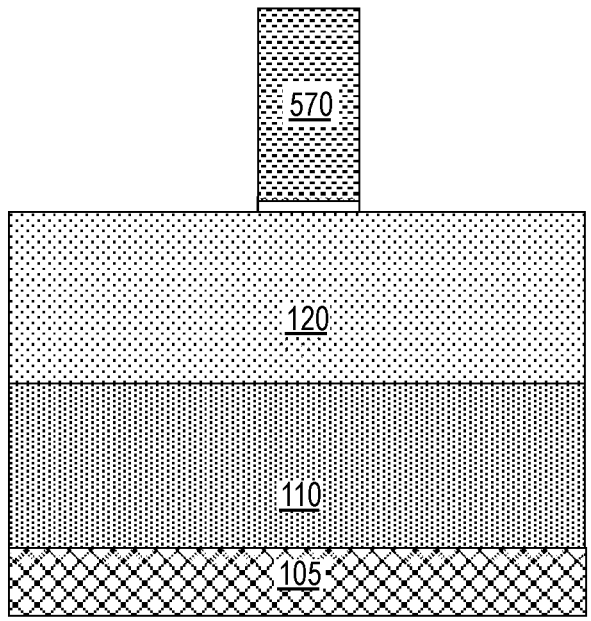
Figure 5C:
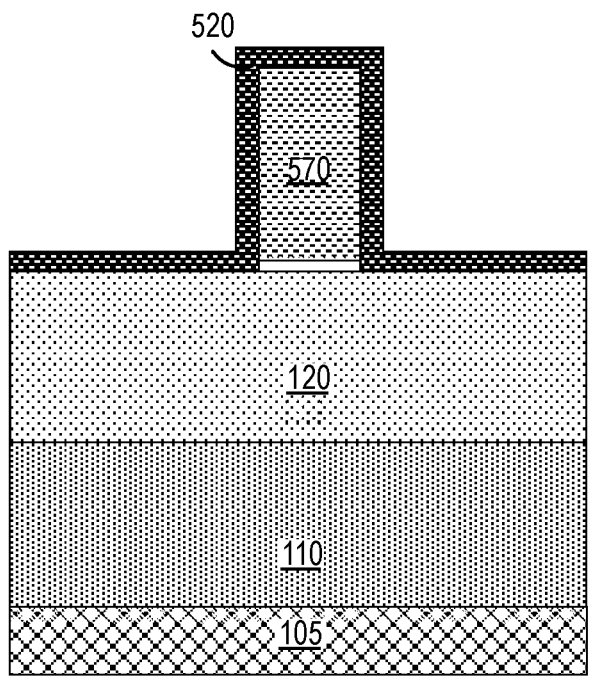
Figure 6C:
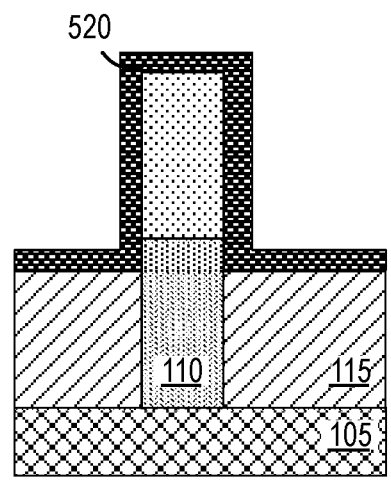
Figure 6D:
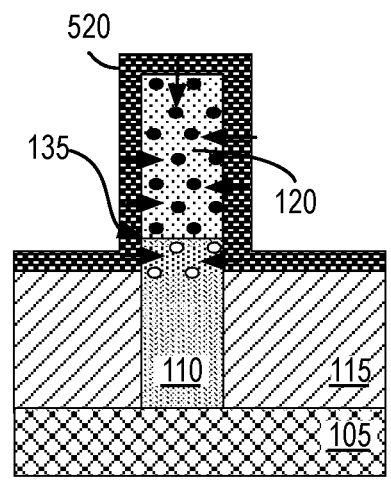
Figure 6E:
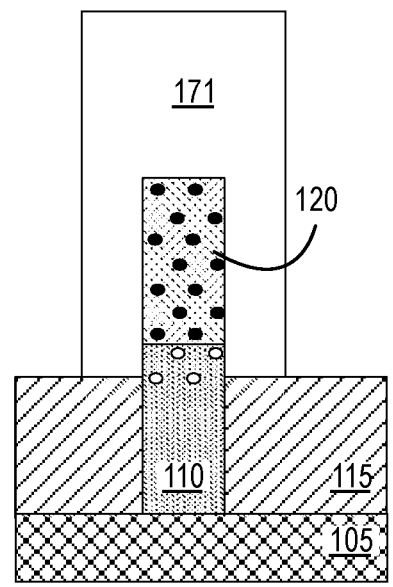
Figure 6F:
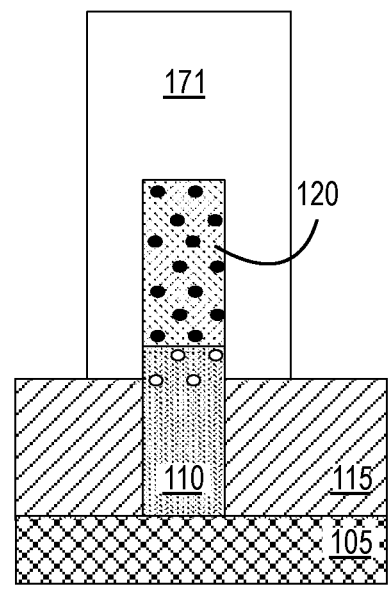
Figure 6G:
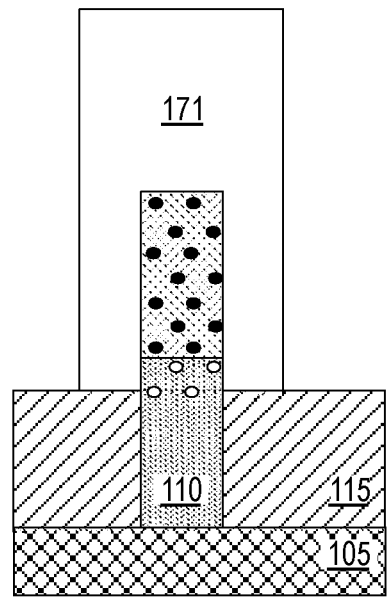
Figure 6H:
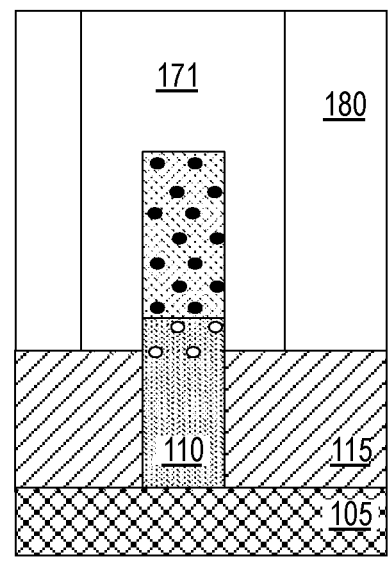

In the exemplary embodiment, illustrated in FIGS. 5C and 6C, a thin film 520 doped with the dopant to be delivered to the surface of the hetero-fin is deposited onto exposed surfaces of hetero-fin 103, further covering sacrificial gate 570. In some embodiments, an organometallic source, an oxygen source, and a silicon hydride (e.g., silane) is reacted by a plasma discharge to form a doped oxide layer. The oxide coated substrate is then heated to drive impurities from the oxide into the semiconductor. Exemplary doped thin films that may be utilized include: selenium-doped oxide, tellurium-doped oxide, or carbon-doped oxide. Other exemplary embodiments include non-stoichiometric silicon-rich silicon nitride films. As further illustrated in FIG. 6D, dopants are diffused from thin film 520 into regions of hetero-fin 103 proximate to all surfaces contacting doped thin film 520. Because doped thin film 520 is deposited on all exposed fin surfaces, dopants need only diffuse approximately ½ the fin width from each fin sidewall. For example, where fin width $W_1$ is less than 10 nm, dopants need only diffuse less than 5 nm to occupy lattice sites throughout the entire fin width. Dopants applied to the fin surface may therefore be diffused to be substantially uniform within the fin volume. Once activated, differences in amphoterism then ensure any doped portion of sub-fin 110 maintain a p-n junction located at the heterojunction 135.

Returning to FIG. 4, operations 430 and 440 may be iterated multiple times as needed to achieve a desired dopant concentration, as a function of at least dopant concentration in the dopant media, dopant mobility, and dopant activation efficiency. Following lightly doping III-V fin, method 401 continues with fabricating a lateral spacer around the channel mask at operation 450. Any conventional self-aligned lateral spacer process may be employed at operation 450 to form a protective structure over the lightly doped tip region and/or sub-tip region and laterally standoff subsequent processing from the channel mask. For example, a dielectric (e.g., silicon dioxide and/or silicon nitride) may be conformally blanket deposited over the hetero-fin and over the channel mask. An anisotropic etch is then employed to clear the dielectric except along edged of topography. In exemplary embodiments further illustrated in FIGS. 5E and 6E, lateral spacer 171 forms adjacent to sacrificial gate 570. Because of the proximity of fin tip region to sacrificial gate 570 (as it was self-aligned), lateral spacer 171 extends over the lightly doped fin tip region. Lateral spacer 171 also forms adjacent to sidewalls of fin 120, as well as any exposed sidewalls of sub-fin 110.

In some embodiments, of method 401 (FIG. 4), fin surface doping may be repeated subsequent to operation 450 to further increase the amphoteric dopant quantity in a region now self-aligned to lateral spacer 171. Alternatively, a different (non-amphoteric) dopant may be introduced through a surface doping operation 430 performed subsequent to operation 450. In still other embodiments, lateral spacer formation operation 450 may be re-ordered with respect to surface doping operation 430 such that operations 430 and 440 are performed only after a lateral spacer is formed. For such embodiments, a lateral diffusion of amphoteric dopants may be relied upon to dope the tip and sub-tip regions in a manner self-aligned to the lateral spacer.

Once light doping of the hetero-fin is complete, method 401 proceeds to operation 460 where source/drain regions are formed. In some embodiments, operation 460 entails etching ends of at least fin 120 and epitaxially re-growing a doped III-V semiconductor from seeding surfaces of fin 120 and/or sub-fin 110. Any known epitaxial source/drain regrowth technique may be employed. In exemplary embodiments further illustrated in FIGS. 5F and 6F, an etch selective to fin 120 relative to sub-fin 110 is performed to remove ends of fin 120 unprotected by sacrificial gate 570 or lateral spacer 171. This source/drain recess etch may undercut lateral spacer 171 by some predetermined amount, however at least some lightly-doped tip portion 134 remains. Dopants introduced into sub-fin 110 also remain. As further illustrated in FIGS. 5G and 6G, a crystalline heteroepitaxial source/drain 140 is then grown, for example by any of metal-organic chemical vapor deposition (MOCVD), molecular beam epitaxy (MBE), or hydride vapor phase epitaxy (HVPE). The material (e.g., InAs or other III-V material) may be heavily in-situ doped (e.g., n-type). In exemplary embodiments, the source/drain regrowth does not employ amphoteric dopants.

In alternate embodiments, no source/drain recess etch is performed at operation 460, and instead source/drain end portions of fin 120 are heavily doped by any known technique, including ion implantation. For some of these embodiments, source/drain doping again does not employ amphoteric dopants. A raised source/drain may be grown over source/drain end portions of fin 120. For example any of the heteroepitaxial techniques describe above may be employed to form a raised source/drain material of narrow bandgap. This epitaxial material may further serve as a source of dopants, which are diffused into source/drain end portions of fin 120. In exemplary embodiments, the raised source/drain does not employ amphoteric dopants.

Figure 5D:
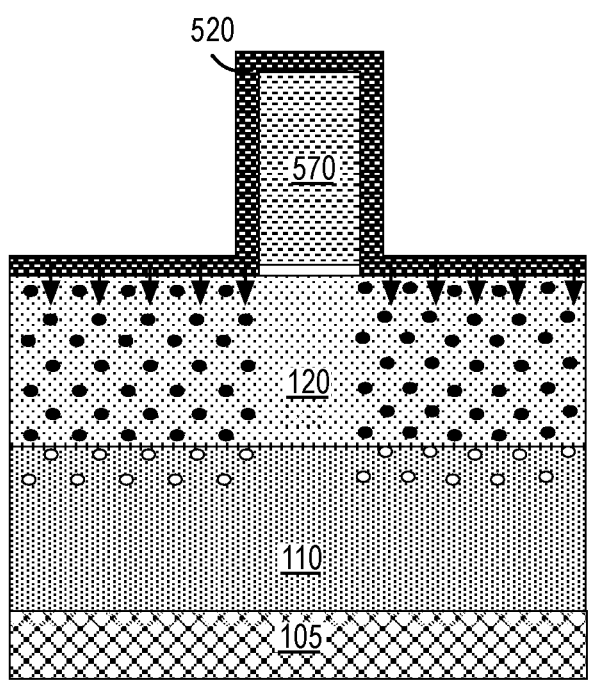
Figure 5E:
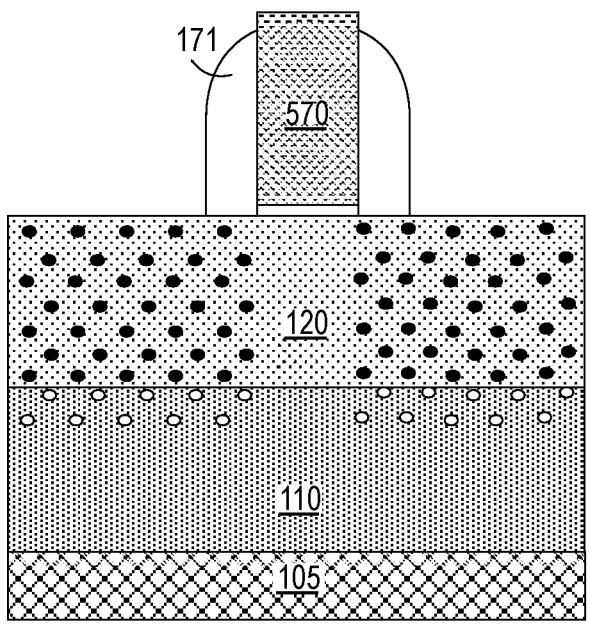
Figure 5F:
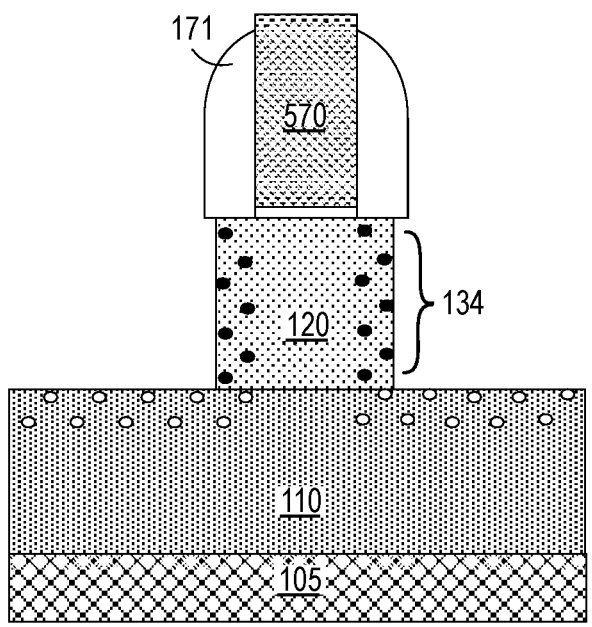
Figure 5G:
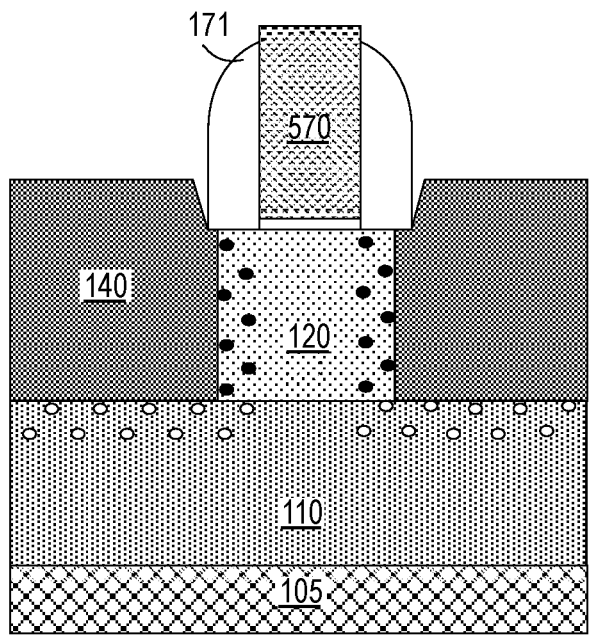
Figure 5H:
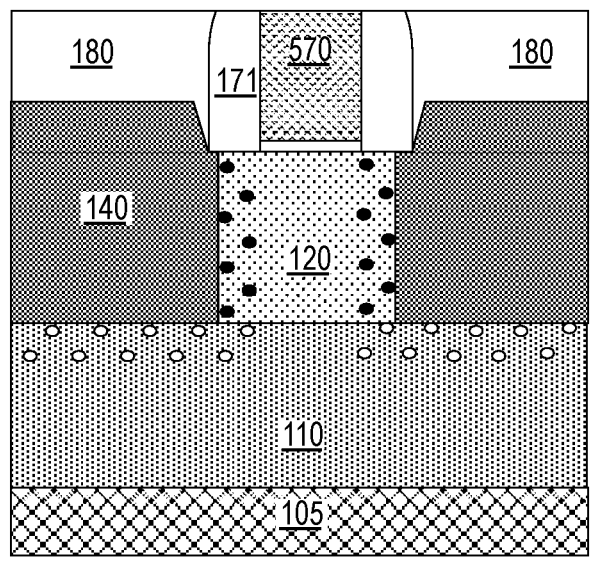
Figure 5K:
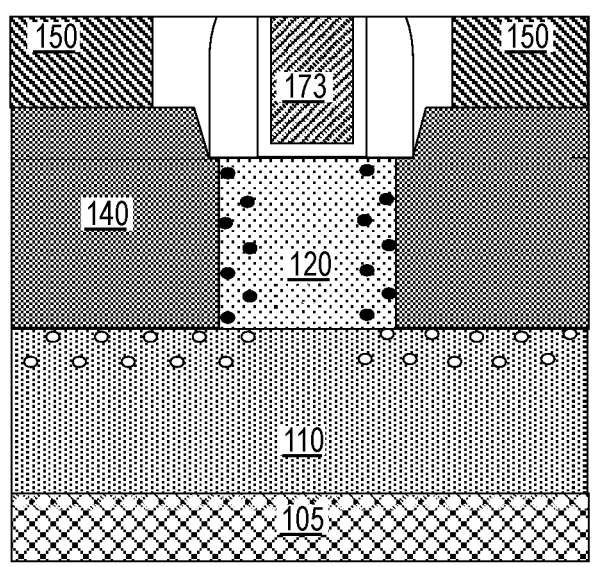
Figure 6K:
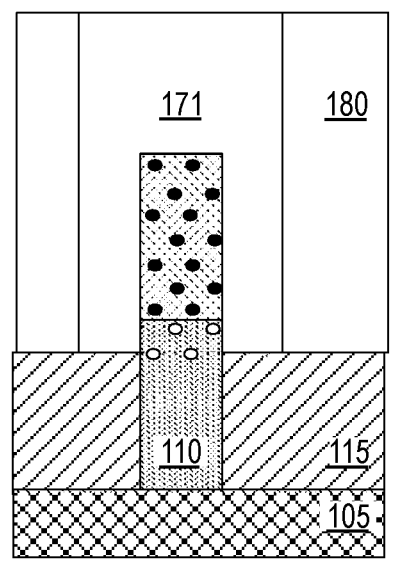

Returning to FIG. 4, method 401 continues at operation 470 where the channel mask is replaced with a permanent gate stack. Method 401 is then substantially completed with any suitable contact metallization and backend processing performed at operation 480. For the exemplary embodiment further illustrated in FIGS. 5H and 6H, finFET isolation 180 is deposited and planarized to expose a top of sacrificial gate 570. As further depicted in FIGS. 5I and 6I, sacrificial gate 570 is removed selectively relative to isolation 180, thereby exposing the channel region of fin 120 (and potentially a sub-channel region of fin 110). A permanent gate stack including a gate dielectric 172 and gate electrode 173 is formed over at least two sidewalls of the fin structures, as depicted in FIGS. 5J and 6J. While any known gate stack materials may be utilized, in one exemplary embodiment a high-k dielectric material is employed along with a metal gate electrode having a work function suitable for the III-V composition of fin 120. As illustrated in FIGS. 5K and 6K, source/drain contact metallization 150 is formed by any known technique, and finFET 101 is substantially as introduced in FIG. 1A-1D.

Figure 7:
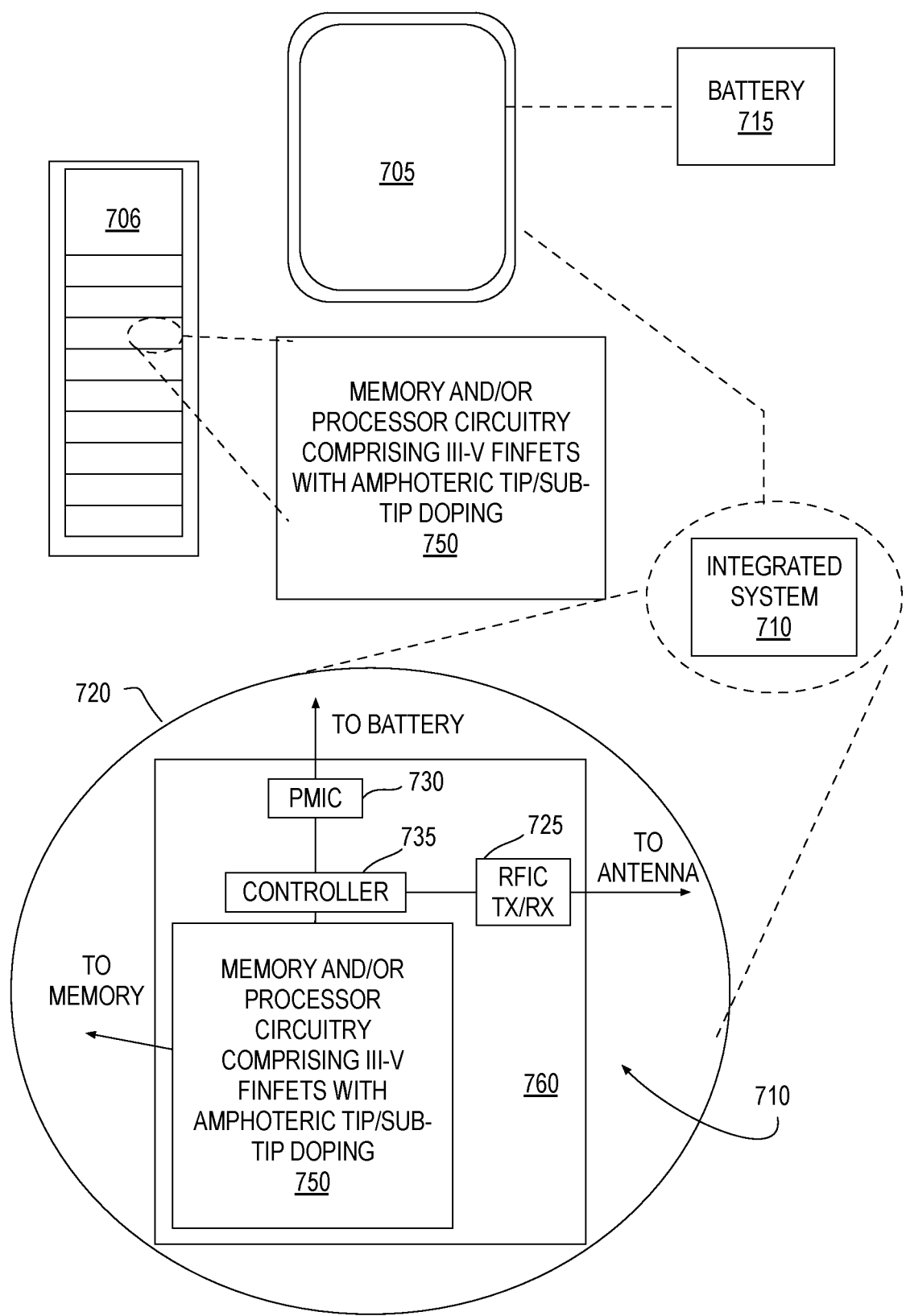
FIG. 7 illustrates a mobile computing platform and a data server machine employing an SoC including a plurality of III-V finFETs including active dopants in a lightly-doped region of the fin structure, in accordance with embodiments of the present invention.

FIG. 7 illustrates a mobile computing platform and a data server machine employing an SoC including heteroepitaxial III-V n-type transistors with lightly-doped tip and/or sub-tip regions, doped for example with amphoteric dopant as describe elsewhere herein. The server machine 706 may be any commercial server, for example including any number of high-performance computing platforms disposed within a rack and networked together for electronic data processing, which in the exemplary embodiment includes a packaged monolithic SoC 750. The mobile computing platform 705 may be any portable device configured for each of electronic data display, electronic data processing, wireless electronic data transmission, or the like. For example, the mobile computing platform 705 may be any of a tablet, a smart phone, laptop computer, etc., and may include a display screen (e.g., a capacitive, inductive, resistive, or optical touchscreen), a chip-level or package-level integrated system 710, and a battery 715.

Whether disposed within the integrated system 710 illustrated in the expanded view 720, or as a stand-alone packaged chip within the server machine 706, packaged monolithic SoC 750 includes a memory block (e.g., RAM), a processor block (e.g., a microprocessor, a multi-core microprocessor, graphics processor, or the like) including at least one heteroepitaxial III-V n-type transistors with lightly-doped tip and/or sub-tip regions, doped for example with amphoteric dopant as describe elsewhere herein. The monolithic SoC 750 may be further coupled to a board, a substrate, or an interposer 760 along with, one or more of a power management integrated circuit (PMIC) 730, RF (wireless) integrated circuit (RFIC) 725 including a wideband RF (wireless) transmitter and/or receiver (TX/RX) (e.g., including a digital baseband and an analog front end module further comprises a power amplifier on a transmit path and a low noise amplifier on a receive path), and a controller 735.

Functionally, PMIC 730 may perform battery power regulation, DC-to-DC conversion, etc., and so has an input coupled to battery 715 and with an output providing a current supply to other functional modules. As further illustrated, in the exemplary embodiment, RFIC 725 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 4G, and beyond. In alternative implementations, each of these board-level modules may be integrated onto separate ICs or integrated into monolithic SoC 750.

Figure 8:
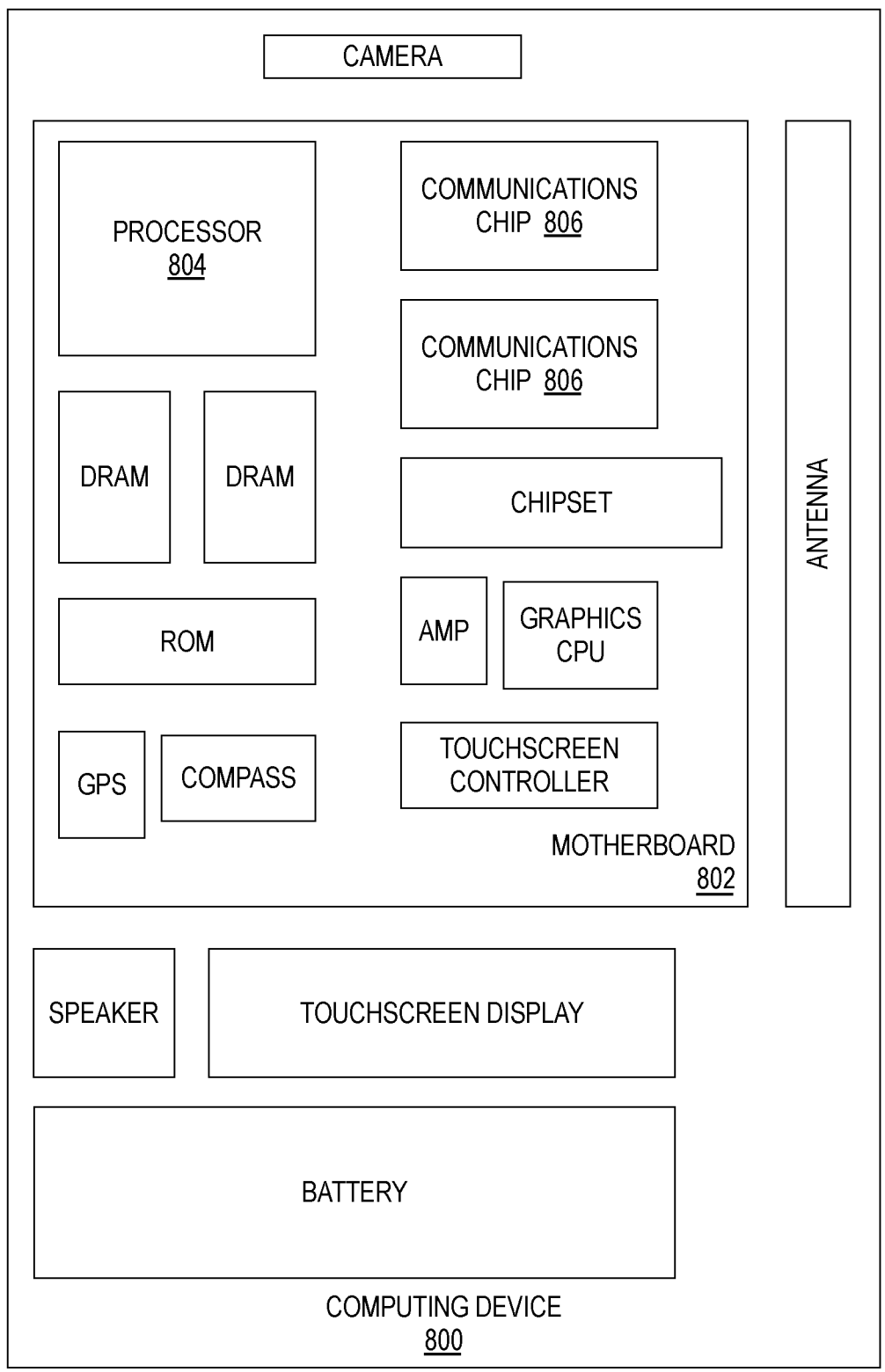
FIG. 8 is a functional block diagram of an electronic computing device, in accordance with an embodiment of the present invention.

FIG. 8 is a functional block diagram of an electronic computing device, in accordance with an embodiment of the present invention. Computing device 800 may be found inside platform 705 or server machine 706, for example. Device 800 further includes a motherboard 802 hosting a number of components, such as, but not limited to, a processor 804 (e.g., an applications processor), which may further incorporate at least one heteroepitaxial III-V n-type transistors with lightly-doped tip and/or sub-tip regions, doped for example with amphoteric dopant as describe elsewhere herein. Processor 804 may be physically and/or electrically coupled to motherboard 802. In some examples, processor 804 includes an integrated circuit die packaged within the processor 804. In general, the term "processor" or "microprocessor" may refer to any device or portion of a device that processes electronic data from registers and/or memory to transform that electronic data into other electronic data that may be further stored in registers and/or memory.

In various examples, one or more communication chips 806 may also be physically and/or electrically coupled to the motherboard 802. In further implementations, communication chips 806 may be part of processor 804. Depending on its applications, computing device 800 may include other components that may or may not be physically and electrically coupled to motherboard 802. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 806 may enable wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 806 may implement any of a number of wireless standards or protocols, including but not limited to those described elsewhere herein. As discussed, computing device 800 may include a plurality of communication chips 806. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In one or more first embodiments, a monolithic transistor comprises a III-V heterostructure disposed on a substrate, the heterostructure comprising a first III-V compound semiconductor material disposed on a second III-V compound semiconductor material. The transistor further comprises a gate stack disposed over a channel region of the first III-V compound semiconductor material. The transistor further comprises a pair of source/drain regions electrically coupled to opposite ends of the channel region through a tip region in the first III-V compound semiconductor material, the tip region comprising an amphoteric dopant.

In at least some of the first embodiments, the majority charge carrier in the channel region is an electron, and the amphoteric dopant preferentially activates as a donor within the first III-V compound semiconductor material, and as an acceptor within the second III-V compound semiconductor material.

In at least some of the first embodiments, a sub-tip region of the second III-V compound semiconductor material comprises a same concentration of the amphoteric dopant as the tip region, the amphoteric dopant augmenting a p-n junction at the heterojunction of the first and second III-V materials.

In at least some of the first embodiments, the first III-V material is selected from the group consisting of InGaAs, InAs, GaAs, InP, and InSb.

In at least some of the first embodiments, the second III-V material is selected from the group consisting of InP, AlSb, GaSb, GaAlSb, GaAsSb, InAlAs, GaAs, and AlGaAs.

In at least some of the first embodiments, the amphoteric dopant is selected from the group consisting of Ge, Si, C, Sn, Te, Se, O.

In at least some of the first embodiments, the first III-V material comprises two or more of In, Ga, and As, and the amphoteric dopant is Si.

In at least some of the first embodiments, the pair of source/drain regions further comprise a third III-V compound semiconductor in contact with the tip region and the second III-V compound semiconductor material, and in contact with a sub-source/drain region of the second III-V compound semiconductor material, and the sub-source/drain region also comprises the amphoteric dopant.

In at least some of the first embodiments immediately above, the sub-source/drain region comprises a same concentration of the amphoteric dopant as the tip region, the amphoteric dopant augmenting a p-n junction at the heterojunction of the third and second III-V materials.

In one or more second embodiments, a CMOS integrated circuit (IC), comprises a silicon substrate, an n-type III-V-channeled fin field effect transistor (FET) disposed over a first region of the substrate. The III-V FET further includes a III-V heterostructure fin disposed on the substrate. The heterostructure fin includes a fin of a first n-type III-V compound semiconductor material disposed on a sub-fin of a p-type III-V compound semiconductor material. The III-V FET further includes a gate stack disposed over a channel region of the fin a pair of source/drain regions comprising a second n-type III-V compound semiconductor material electrically coupled to opposite ends of the channel region through a tip region of the fin, the tip region comprising an amphoteric dopant, and the tip region disposed on a sub-tip region of the sub-fin that also comprises the amphoteric dopant. The CMOS IC further comprises a p-type silicon-channeled FET disposed over a second region of the substrate.

In at least some of the second embodiments, the amphoteric dopant is at least one of Si, C, Ge, Sn, Te, Se, and O, and preferentially activates as a donor within the tip region and as an acceptor within the sub-tip region, and the tip region and sub-tip region comprise a same concentration of the amphoteric dopant.

In at least some of the second embodiments, the second n-type III-V compound semiconductor material is in contact with a sub-source/drain region of the second III-V compound semiconductor material, the sub-source/drain region also comprises a same concentration of the amphoteric dopant as the tip region.

In one or more third embodiments, a method of fabricating a III-V-channeled fin field effect transistor (FET) comprises forming a III-V heterostructure fin disposed on a substrate, the heterostructure fin of an n-type III-V compound semiconductor material disposed on a sub-fin of a p-type III-V compound semiconductor material. The method comprises forming a mask over a channel region of the fin. The method comprises contacting exposed surfaces of the fin and the sub-fin with a dopant media comprising an amphoteric dopant. The method further comprises thermally diffusing the amphoteric dopant from the dopant media into the fin and sub-fin. The method further comprises forming lateral spacer adjacent to the mask to cover a tip portion of the fin and a sub-tip portion of the sub-fin, both comprising the amphoteric dopant. The method further comprises forming source and drain regions at ends of the fin not covered by the mask or lateral spacer. The method further comprises replacing the mask with a gate stack. The method further comprises forming contact metallization to the source and drain regions.

In at least some of the third embodiments, contacting exposed surfaces of the fin and the sub-fin to the dopant media further comprises depositing, over sidewall surfaces of the fin, a dopant source film containing a mobile form of the amphoteric dopant, and capping the dopant source film with a second film. The method further comprises stripping off the dopant source film and the capping film selectively to the III-V heterostructure fin after thermally diffusing the amphoteric dopant.

In at least some of the third embodiments, contacting exposed surfaces of the fin and the sub-fin to the dopant media further comprises depositing a dopant source film containing a mobile form of the amphoteric dopant over sidewall surfaces of the fin and sub-fin, and depositing a capping film over the dopant source fill. The method further comprises stripping off the capping film selectively to the III-V heterostructure fin after thermally diffusing the amphoteric dopant.

In at least some of the third embodiments, contacting exposed surfaces of the fin and the sub-fin to the dopant media further comprises wetting sidewall surfaces of the fin and sub-fin with a liquid comprising amphoteric dopant moieties, and depositing a capping film over amphoteric dopant moieties bound to the sidewall surfaces. The method further comprises stripping the capping film from the III-V heterostructure fin after thermally diffusing the amphoteric dopant.

In at least some of the third embodiments, forming the III-V heterostructure fin further comprises recessing an amorphous isolation material from around sidewalls of the heterostructure fin to expose sidewalls of the n-type III-V compound semiconductor material and at least a portion of the p-type III-V compound semiconductor material.

In at least some of the third embodiments, forming the source and drain regions further comprises recess etching the n-type III-V compound semiconductor material not covered by the mask or lateral spacer, and epitaxially growing a narrower bandgap n-type III-V compound semiconductor material further comprising a donor dopant other than the amphoteric dopant.

In at least some of the third embodiments, the n-type III-V material comprises two or more of In, Ga, and As, and the amphoteric dopant is Si.

In at least some of the third embodiments, the method further comprises contacting exposed surfaces of the fin and the sub-fin not covered by the mask or the lateral spacer with a dopant media comprising the amphoteric dopant, and thermally diffusing the amphoteric dopant from the dopant media into the fin and sub-fin before forming the source and drain regions.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A transistor structure, comprising:
    a III-V heterostructure comprising a first III-V compound semiconductor material in contact with a second III-V compound semiconductor material;
    a gate stack over a channel region of the first III-V compound semiconductor material, wherein the gate stack comprises a gate electrode separated from the channel region by a gate dielectric; and
    a source region and a drain region electrically coupled to opposite ends of the channel region through a tip region in the first III-V compound semiconductor material, the tip region in contact with a sub-tip region of the second III-V compound semiconductor material, wherein both the tip region and sub-tip region comprise an amphoteric dopant, which activates as a donor within the first III-V compound semiconductor material, and as an acceptor within the second III-V compound semiconductor material.

2. The transistor structure of claim 1, wherein:
    a majority charge carrier in the channel region is an electron; and
    the second III-V compound semiconductor material has p-type conductivity.

3. The transistor structure of claim 1, wherein a sub-tip region of the second III-V compound semiconductor material comprises a same concentration of the amphoteric dopant as the tip region, the amphoteric dopant augmenting a p-n junction at the heterojunction of the first and second III-V compound semiconductor materials.

4. The transistor structure of claim 1, wherein the first III-V material is an alloy comprising any of InGaAs, InAs, GaAs, InP, or InSb.

5. The transistor structure of claim 4, wherein the second III-V material is an alloy comprising any of AlSb, InP, GaSb, GaAlSb, GaAsSb, InAlAs, GaAs, or AlGaAs.

6. The transistor structure of claim 1, wherein the amphoteric dopant comprises one or more of Si, C, Ge, Sn, Te, Se, or O.

7. The transistor structure of claim 1, wherein:
    the first III-V material comprises an alloy of two or more of: In, Ga, or As; and
    the amphoteric dopant comprises Si or C.

8. The transistor structure of claim 1, wherein:
    one or more of the source region and drain region further comprises a third III-V compound semiconductor material in contact with the tip region, and in contact with a sub-source or sub-drain region of the second III-V compound semiconductor material that is below the source or drain region; and
    the sub-source or sub-drain region also comprises the amphoteric dopant.

9. The transistor structure of claim 8, wherein the sub-source or sub-drain region comprises a same concentration of the amphoteric dopant as the tip region, the amphoteric dopant augmenting a p-n junction at a heterojunction of the second and third III-V materials that is between the source and sub-source regions, or between the drain and sub-drain regions.

10. A CMOS integrated circuit (IC), comprising:
    a silicon substrate;
    an n-type III-V-channeled fin field effect transistor (FET) structure over a first region of the substrate, the n-type III-V-channeled FET structure further including:
        a III-V heterostructure fin including a fin of a first n-type III-V compound semiconductor material in contact with a sub-fin of a p-type III-V compound semiconductor material;
        a gate stack disposed over a channel region of the fin, wherein the gate stack comprises a gate electrode separated from the channel region by a gate dielectric;
        a source region and a drain region comprising a second n-type III-V compound semiconductor material electrically coupled to opposite ends of the channel region through a tip region of the fin, the tip region comprising an amphoteric dopant, and the tip region in contact with a sub-tip region of the sub-fin that also comprises the amphoteric dopant, wherein the amphoteric dopant activates as a donor within the first n-type III-V compound semiconductor material, and as an acceptor within the p-type III-V compound semiconductor material; and
    a p-type silicon-channeled FET over a second region of the substrate.

11. The CMOS IC of claim 10, wherein:
    the amphoteric dopant comprises at least one of Si, C, Ge, Sn, Te, Se, and O; and
    the tip region and sub-tip region comprise a same concentration of the amphoteric dopant.

12. The CMOS IC of claim 10, wherein the second n-type III-V compound semiconductor material is in contact with a sub-source region or sub-drain region of the p-type III-V compound semiconductor material; and
    the sub-source region or sub-drain region also comprises a same concentration of the amphoteric dopant as the tip region.

* * * * *